(12) United States Patent
Wagner et al.

(10) Patent No.: US 10,812,073 B2
(45) Date of Patent: Oct. 20, 2020

(54) SUPERCONDUCTING MICROWAVE SWITCH

(71) Applicant: RAYTHEON BBN TECHNOLOGIES CORP., Cambridge, MA (US)

(72) Inventors: Andrew Phillips Wagner, Boston, MA (US); Leonardo Matteo Ranzani, Cambridge, MA (US); Guilhem Jean Antoi Ribeill, Arlington, MA (US); Thomas Ohki, Arlington, MA (US)

(73) Assignee: Raytheon BBN Technologies Corp, Cambridge, MA (US)

( * ) Notice: Subject to any disclaimer, the term of this patent is extended or adjusted under 35 U.S.C. 154(b) by 0 days.

(21) Appl. No.: 16/558,017

(22) Filed: Aug. 30, 2019

(65) Prior Publication Data

US 2020/0136612 A1     Apr. 30, 2020

Related U.S. Application Data

(60) Provisional application No. 62/753,839, filed on Oct. 31, 2018.

(51) Int. Cl.
*H03K 17/92* (2006.01)
*H03H 3/00* (2006.01)
*H01P 1/10* (2006.01)
*H03H 7/01* (2006.01)

(52) U.S. Cl.
CPC ............... *H03K 17/92* (2013.01); *H01P 1/10* (2013.01); *H03H 3/00* (2013.01); *H03H 7/0115* (2013.01); *H03H 2210/026* (2013.01)

(58) Field of Classification Search
CPC . H03K 17/92; H01P 1/10; H03H 3/00; H03H 7/0115; H03H 2210/026
See application file for complete search history.

(56) References Cited

U.S. PATENT DOCUMENTS 5,350,739 A * 9/1994 Martens .................. H01L 39/18
                                                                    327/366
5,411,937 A * 5/1995 Wendt ..................... B82Y 10/00
                                                                    216/3

(Continued)

OTHER PUBLICATIONS

Gurevich, et al.,"Self-heating in normal metals and superconductors", Institute for High Temperatures, USSR Academy of Sciences, Oct. 4, 1987, 60 pages.

(Continued)

*Primary Examiner* — John W Poos
(74) *Attorney, Agent, or Firm* — Lewis Roca Rothgerber Christie LLP (57) ABSTRACT

A microwave switch. In some embodiments, the microwave switch includes a substrate, a signal conductor, a first ground conductor, on a first side of the signal conductor, and a second ground conductor, on a second side of the signal conductor. The signal conductor, the first ground conductor, and the second ground conductor may be planar conductors on a planar top surface of the substrate. The signal conductor may have a first portion composed of a superconducting material, and a second portion having a reduced cross section, a cross-sectional area of the second portion being less than 120 nm.

14 Claims, 11 Drawing Sheets

(56) References Cited

U.S. PATENT DOCUMENTS 5,841,342 A * 11/1998 Hegmann ................. H01P 1/10
338/325
7,307,045 B2 * 12/2007 Kawai ..................... H01P 1/127
333/161

OTHER PUBLICATIONS

Mccaughan, et al., "A Superconducting-Nanowire Three-Terminal Electrothermal Device", NANOLetters, Department of Electrical Engineering and Computer Science, Massachusetts Institute of Technology, revised Sep. 3, 2014, 6 pages.
Naaman, et al., "On-chip Josephson junction microwave switch", Applied Physics Letters 108, 112601 (2016), published Mar. 14, 2016, 5 pages.
Wagner, et al., "Demonstration of a superconducting nanowire microwave switch", Applied Physics Letters 115, 172602 (2019), accepted Oct. 10, 2019, 6 pages.
Yang, et al., "Modeling the Electrical and Thermal Response of Superconducting Nanowire Single-Photon Detectors", IEEE Transactions on Applied Superconductivity, vol. 17, No. 2, Jun. 2007, 5 pages.

* cited by examiner

United States Patent 10,812,073 B2

SUPERCONDUCTING MICROWAVE SWITCH

CROSS-REFERENCE TO RELATED APPLICATION(S)

The present application claims priority to and the benefit of U.S. Provisional Application No. 62/753,839, filed Oct. 31, 2018, entitled "SUPERCONDUCTING NANO-WIRE EMBEDDED IN A TRANSMISSION LINE, USED AS A FAST RADIO FREQUENCY SWITCH", the entire content of which is incorporated herein by reference.

GOVERNMENT LICENSE RIGHTS

This invention was made with U.S. Government support under contract No. W911NF-14-C-0089 awarded by the Department of Defense. The U.S. Government has certain rights in this invention.

FIELD

One or more aspects of embodiments according to the present invention relate to switching, and more particularly to a superconducting microwave switch.

BACKGROUND

In numerous commercial and military applications, microwave switches may be used for various purposes. For example, a Dolinar receiver may perform optical coherent state discrimination using a closed loop quantum measurement. Such a receiver may employ a microwave switch, and its performance may be affected by the switching time of the microwave switch. Similarly, qubit control in a quantum computer may employ microwave switching. In various cryogenic applications, such as a radar system having cryogenic components, low switching power dissipation may be advantageous to avoid burdening the cryogenic system with a high heat load.

Thus, there is a need for an improved microwave switch.

SUMMARY

According to an embodiment of the present invention, there is provided a microwave switch, including: a substrate; a signal conductor; a first ground conductor, on a first side of the signal conductor; and a second ground conductor, on a second side of the signal conductor, the signal conductor, the first ground conductor, and the second ground conductor being planar conductors on a planar top surface of the substrate, the signal conductor having: a first portion composed of a superconducting material, and a second portion having a reduced cross section, a width of the second portion being less than 120 nm.

In some embodiments, the second portion is a portion of the first portion.

In some embodiments, a length of the second portion is between 100 nm and 200 nm.

In some embodiments, the microwave switch is configured to operate in: a first state, in which the first portion is in a superconducting state, and a second state, in which the first portion is in a normal state.

In some embodiments, in the second state, a resistance of the first portion is at least five times a characteristic impedance of the signal conductor, the first ground conductor, and the second ground conductor at a first location, the first location not being in the second portion.

In some embodiments, the characteristic impedance is greater than 25 ohms and less than 100 ohms.

In some embodiments, the characteristic impedance is about 50 ohms.

In some embodiments, the resistance of the first portion in the second state is at least 300 ohms.

In some embodiments, the microwave switch has a first signal port at one end of the signal conductor and a second signal port at a second end of the signal conductor, wherein: an insertion loss from the first signal port to the second signal port, in the second state, is greater, over a range of frequencies spanning 1 GHz, by at least 10 dB, than the insertion loss in the first state.

In some embodiments, the microwave switch further includes a first bias port and a second bias port, a current path from the first bias port and a second bias port extending through the second portion.

In some embodiments, the microwave switch is configured to operate, in steady state, in: the second state, when a current flowing between the first bias port and the second bias port exceeds a threshold current, and the first state, otherwise.

In some embodiments, the threshold current is less than 20 microamperes.

In some embodiments, in the second state, the product of the current flowing between the first bias port and the second bias port, and a potential difference between the first bias port and the second bias port is less than 200 nW.

In some embodiments, in the second state, the product of the current flowing between the first bias port and the second bias port, and a potential difference between the first bias port and the second bias port is less than 4 nW.

In some embodiments, the microwave switch is capable of switching from the first state to the second state in less than 1 ns.

In some embodiments, the microwave switch is capable of switching from the second state to the first state in less than 1 ns.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a superconducting microwave switch provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
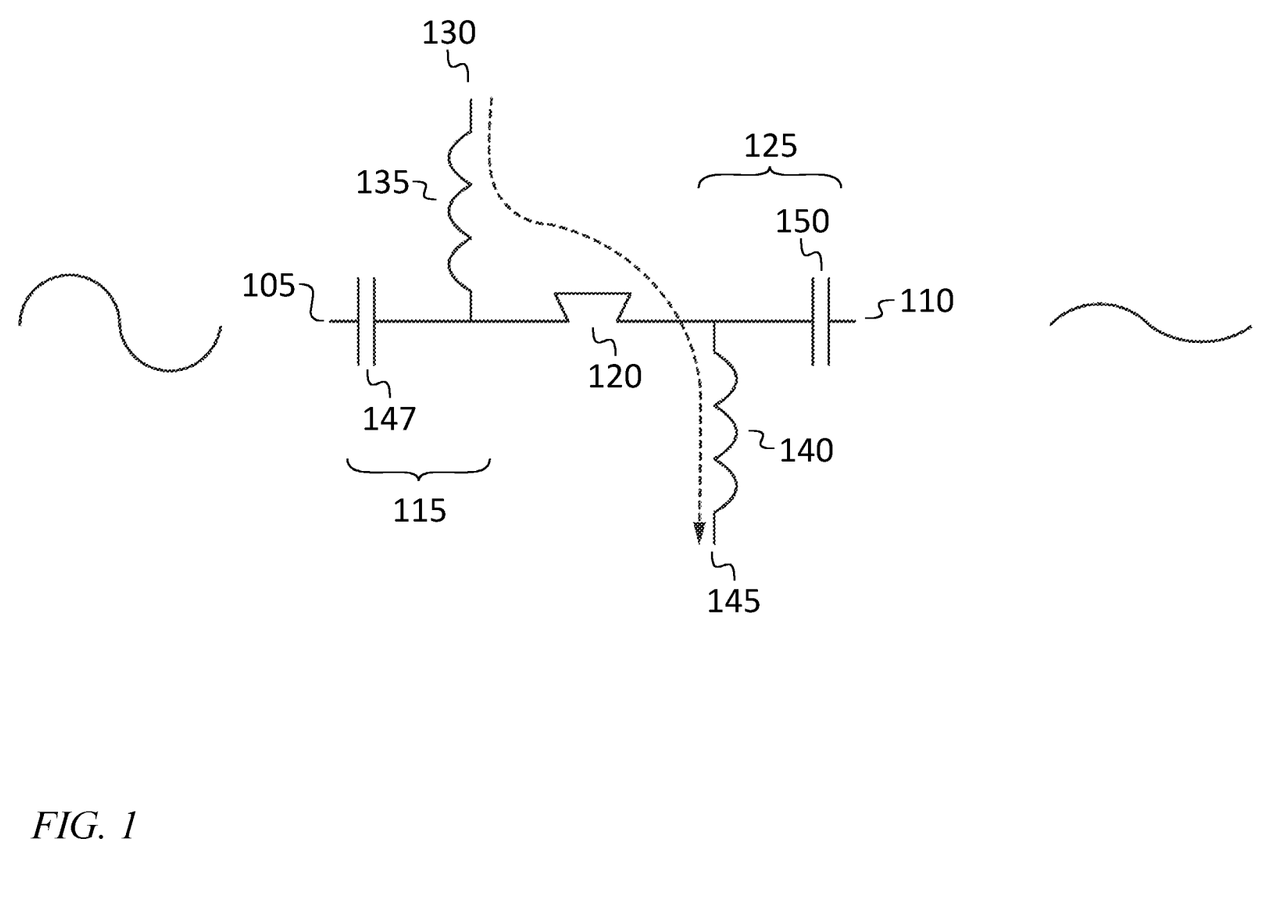
FIG. 1 is circuit diagram of a microwave switch, according to an embodiment of the present invention.

Referring to FIG. 1, in some embodiments, a microwave switch has a first radio frequency (RF) port, or "signal port" 105, and a second signal port 110. A signal path from the first signal port 105 to the second signal port 110 includes a first bias tee 115, a narrowed portion of conductor (or "nanowire") 120, and a second bias tee 125. The resistance of the narrowed portion 120 may be controlled (as discussed in further detail below) by a bias current (shown in FIG. 1 as a dashed arrow) that may flow from a first bias port 130, through an inductor 135 of the first bias tee 115, through the narrowed portion 120, through an inductor 140 of the second bias tee 125 and to a second bias port 145. In the embodiment of FIG. 1, the first bias tee 115 includes a capacitor 147 and the second bias tee 125 includes a capacitor 150; these capacitors constrain the bias current to flow through the narrowed portion 120 (i.e., they prevent bias current from flowing through other circuits that may be connected to the first signal port 105 and the second signal port 110). The narrowed portion may have a width, at its narrowest point, of less than 120 nm (e.g., of about 80 nm) and a length of about twice its width (e.g., about 160 nm).

Figure 2A:
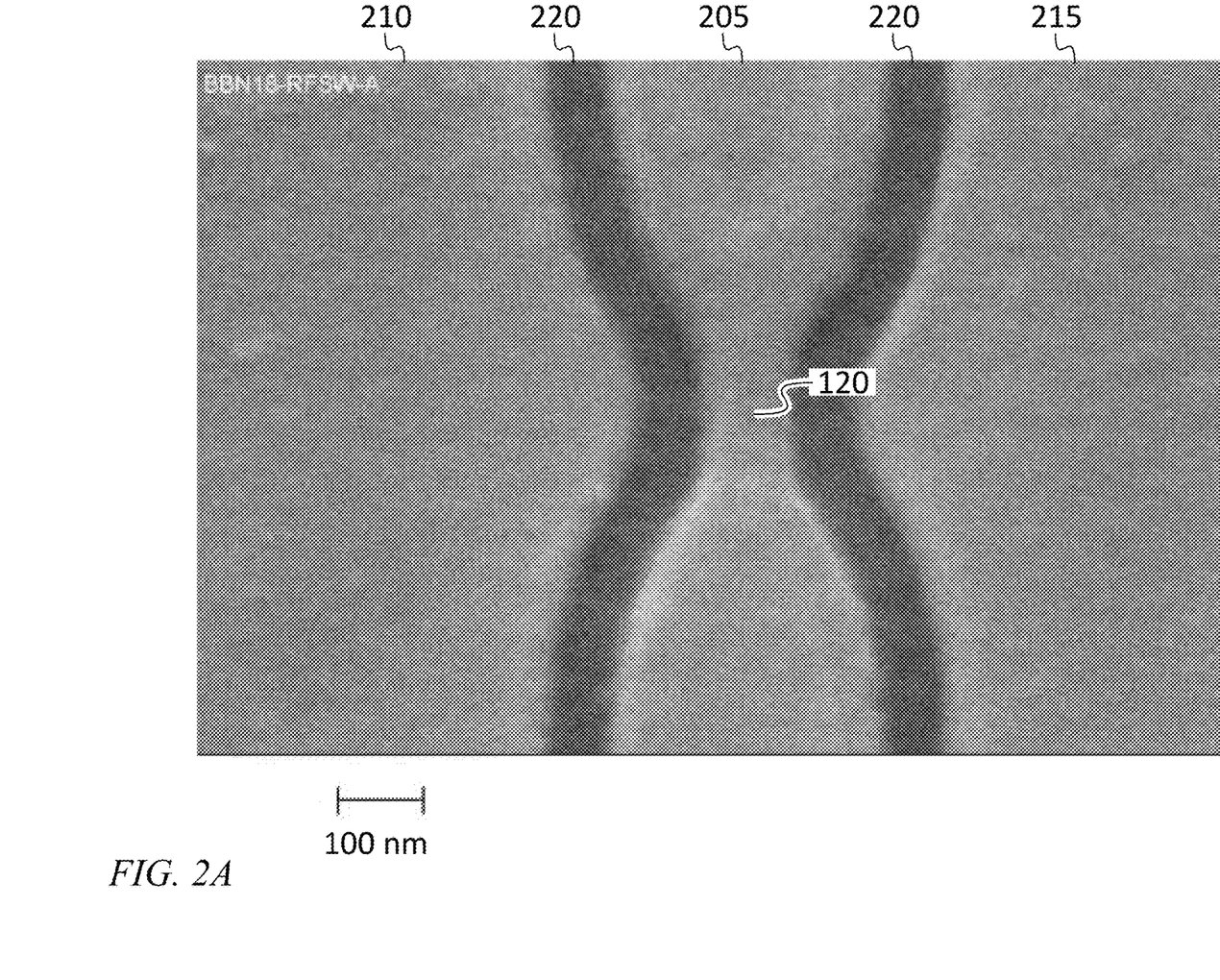
FIG. 2A is a micrograph of a microwave switch, according to an embodiment of the present invention.

The RF signal path from the first signal port 105 to the second signal port 110 may include a planar signal conductor (e.g., a conductive strip) on a dielectric layer, and planar ground conductors (e.g., a first ground conductor and a second ground conductor) may be present on both sides of the signal conductor, forming a coplanar transmission line (e.g., a 50-ohm coplanar transmission line). FIG. 2A shows an example of such a coplanar transmission line configuration, with a central signal conductor 205, a first ground conductor 210 on one side of the central signal conductor 205 and a second ground conductor 215 on the other side of the central signal conductor 205 (FIGS. 2A-2D are micrographs of a reduction to practice of one embodiment of a microwave switch).

FIG. 2A also shows the narrowed portion 120. In the embodiment of FIG. 2A, the central signal conductor 205, the first ground conductor 210, and the second ground conductor 215 are fabricated (by selective removal) of a thin (e.g., 8 nm thick) layer of niobium nitride deposited on a silicon dioxide layer 220 of a silicon wafer with a top surface of thermal oxide (visible in FIG. 2A in the gap between the central signal conductor 205 and the first ground conductor 210, and in the gap between the central signal conductor 205 and the second ground conductor 215). The features visible in FIG. 2A may be formed using e-beam lithography.

In some embodiments, the conductive path between the capacitor 147 of the first bias tee 115 and the capacitor 150 of the second bias tee 125 includes a portion composed of a superconducting material (such as niobium nitride), and the narrowed portion 120 is formed in the portion composed of the superconducting material. The microwave switch, or a portion of it (including the narrowed portion 120) may be cooled by a cryogenic cooling system. In such an embodiment, in a first state, the microwave switch is at sufficiently low temperature and the bias current is less than a threshold current, and the portion composed of the superconducting material is in a superconducting state. In the first state, the resistance of the conductive path between the capacitor 147 of the first bias tee 115 and the capacitor 150 of the second bias tee 125 may be low (e.g., negligible compared to the characteristic impedance of the coplanar transmission line). The narrowed portion 120 may act as a small lumped series inductance, with an inductance of less than 1 picohenry.

If the bias current is increased such that the critical current density of the superconducting material is exceeded, a portion of the narrowed portion 120 may transition from the superconducting state to the normal state, resulting in an initial increase in the resistance of the conductive path between the capacitor 147 of the first bias tee 115 and the capacitor 150 of the second bias tee 125. This may occur, for example, for a total bias current of 6 microamperes. The bias current continuing to flow through this portion may then heat it, causing the region that is in the normal state to grow, resulting in a further increase in the resistance of the conductive path between the capacitor 147 of the first bias tee 115 and the capacitor 150 of the second bias tee 125. In this manner, the microwave switch transitions to a second state in which a portion of the conductive path between the capacitor 147 of the first bias tee 115 and the capacitor 150 of the second bias tee 125 has transitioned from the superconducting state to the normal state, significantly increasing the resistance of the conductive path between the capacitor 147 of the first bias tee 115 and the capacitor 150 of the second bias tee 125.

The size of the region that is in the normal state may continue to grow, approaching a steady-state size at which the heat generated, in the region, by the bias current flowing through it equals the heat extracted by the cooling system. The velocity $v_{hotspot}$ of the boundary between the normal region and the superconducting region may be given by the following equation:

$$v_{hotspot} = v_0 \frac{\psi i^2 - 2}{\sqrt{\psi i^2 - 1}} \text{ where}$$

$$\psi \approx 5.7, i = \frac{I}{I_c}, \text{ and } v_0 \approx 174 \frac{m}{s}.$$

It may then be calculated that the rise time (discussed in further detail below) is about 537 ps, and the power dissipation may be calculated, approximately, as $I_c^2 \approx 26$ nW. Derivations of these equations may be found in A. V. Gurevich and R. G. Mints, Reviews of Modern Physics 59, 941 (1987), which is incorporated herein by reference. The equations apply for a hotspot propagating at a constant velocity and may provide a good estimate for the rise time of the hotspot.

In the second state the resistance of the conductive path between the capacitor 147 of the first bias tee 115 and the capacitor 150 of the second bias tee 125 may be large compared to the characteristic impedance of the coplanar transmission line (e.g., it may be about 20 times the characteristic impedance of the coplanar transmission line), resulting in a significant increase (e.g., an increase of about 20 dB) in the insertion loss of the microwave switch.

Figure 2B:
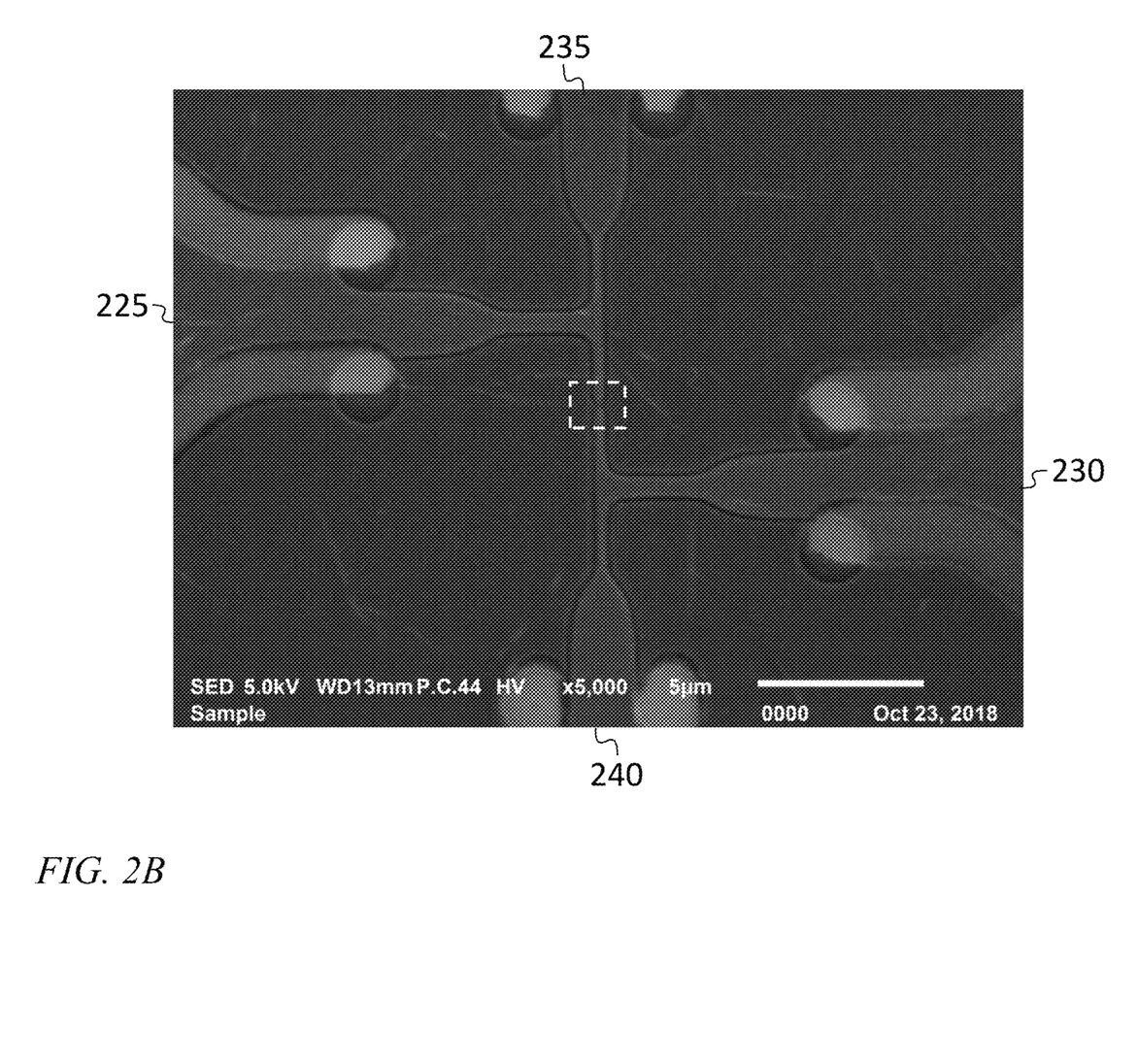
FIG. 2B is a micrograph of a microwave switch, according to an embodiment of the present invention.

FIG. 2B shows a view of a microwave switch, of which the view of FIG. 2A is an enlarged view, with the portion corresponding to FIG. 2A outlined in a dashed line. In FIG. 2B, a first RF trace 225 extends toward the first signal port 105, and a second RF trace 230 extends toward the second signal port 110. A first bias trace 235 extends toward the first bias port 130, and a second bias trace 240 extends toward the second bias port 145. The traces extending to the edges of the view of FIG. 2B are wider than those of FIG. 2A; these wider traces may be fabricated by photolithography. The first bias trace 235 and the second bias trace 240 may each (like the first RF trace 225 and like the second RF trace 230) be the center conductor of a respective coplanar transmission line, making it possible to effect rapid changes in the bias current, for high-speed switching.

Figure 2C:
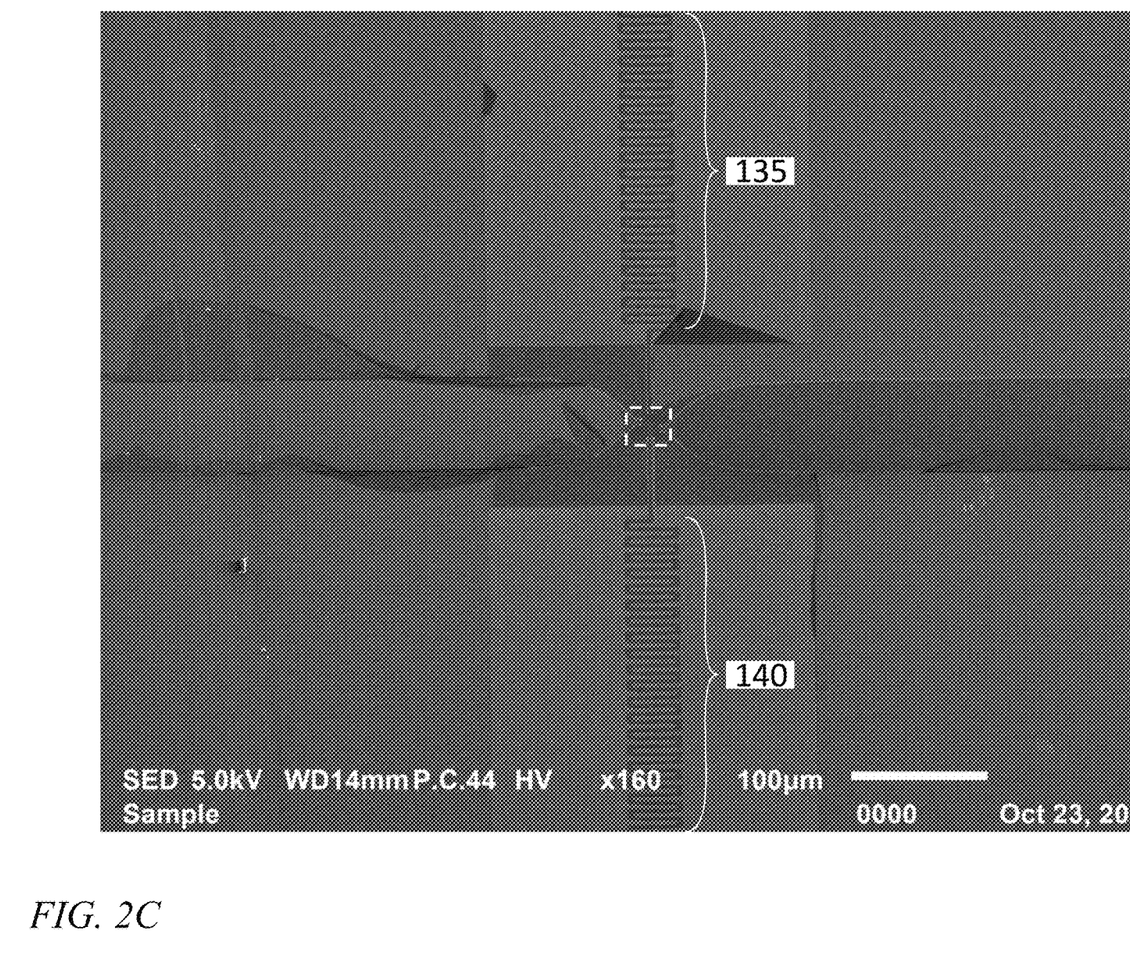
FIG. 2C is a micrograph of a microwave switch, according to an embodiment of the present invention.

FIG. 2C shows a view of a microwave switch, of which the view of FIG. 2B is an enlarged view, with the portion corresponding to FIG. 2B outlined in a dashed line. The inductor 135 of the first bias tee 115 and the inductor 140 of the second bias tee 125 are visible, implemented as meander lines in the embodiment of FIG. 2C.

Figure 2D:
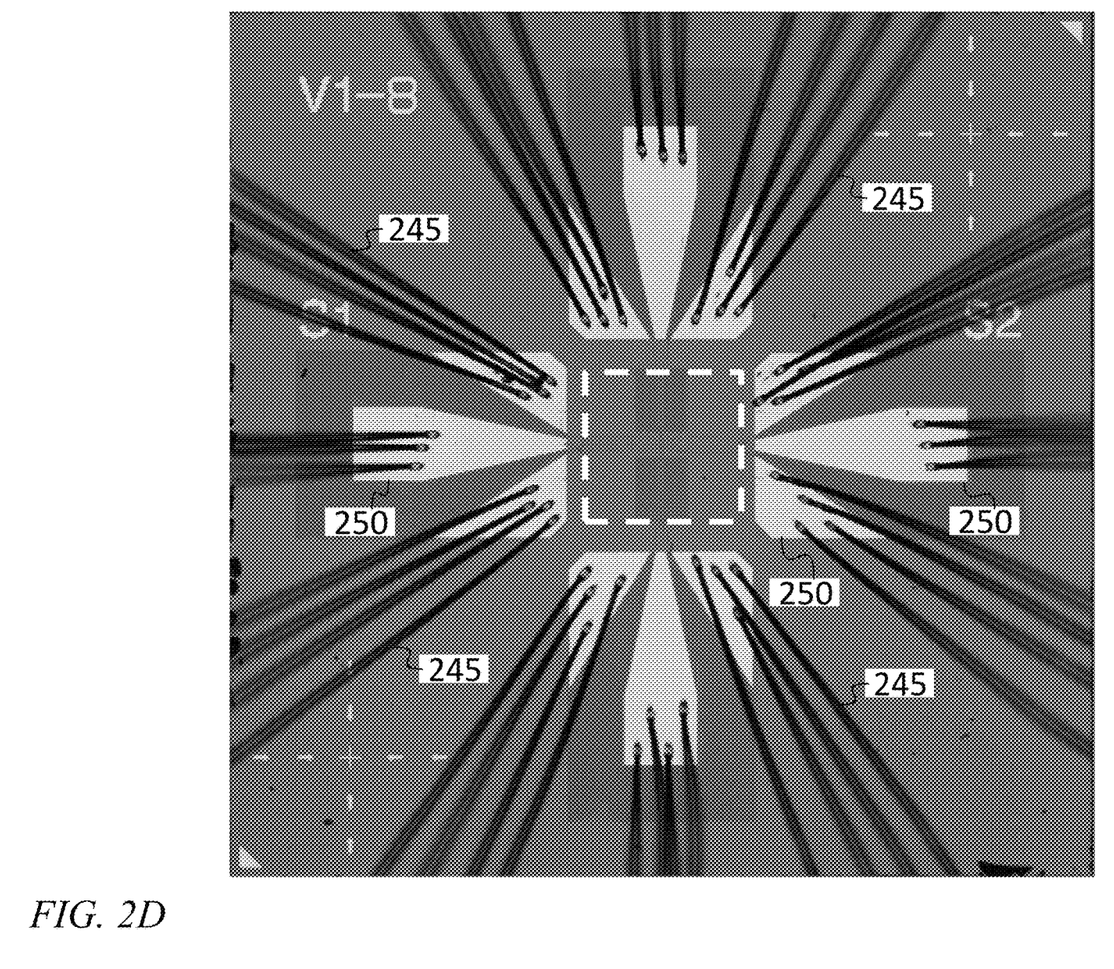
FIG. 2D is a micrograph of a microwave switch, according to an embodiment of the present invention.

FIG. 2D shows a view of a microwave switch, of which the view of FIG. 2C is an enlarged view, with the portion corresponding to FIG. 2C outlined in a dashed line. Wire bonds 245 are used to form connections between (i) wire bond pads 250 connected to the conductive traces and to the ground conductors on the silicon wafer with a top surface of thermal oxide and (ii) surrounding circuitry. In some embodiments the wire bond connections extend from the wire bond pads on the silicon wafer with a top surface of thermal oxide to conductive traces on a ceramic or organic substrate on which the silicon wafer with a top surface of thermal oxide is mounted, and on which the capacitor 147 of the first bias tee 115 and the capacitor 150 of the second bias tee 125 are installed. Such a ceramic or organic substrate may have connectors (e.g., SMA connectors or N connectors) for forming connections to other components. A plurality of wire bonds may be used to form connections to each of the wire bond pads on the silicon wafer with a top surface of thermal oxide, to reduce the total inductance, and to provide redundancy (e.g., in case of failure of one of the wire bonds). The wire bond pads in FIG. 2D are present in four groups of three, each group of three forming connections to the central conductor and to the two ground conductors of a respective coplanar transmission line (for signal or bias).

The embodiment of FIGS. 2A-2D may be fabricated as follows. A layer of thermal oxide (i.e., silicon dioxide) may be grown on a wafer of crystalline silicon to form the silicon wafer with a top surface of thermal oxide. A thin layer of niobium nitride may then be sputtered onto the silicon dioxide, and gold wire bond pads may be deposited using a photoresist mask. Fine features of the microwave switch, such as the narrowed portion 120, and the portions of coplanar transmission line on both sides of the narrowed portion 120, may then be formed using e-beam lithography. Coarser features, such as the wire bond pads and such as the wider coplanar transmission lines extending away from the narrowed portion 120 toward the first signal port 105, the second signal port 110, the first bias port 130, and the second bias port 145, may be formed using photolithography. The substrate may then be mounted on another substrate (as mentioned above) and connections may be made using wire bonds.

Figure 3A:
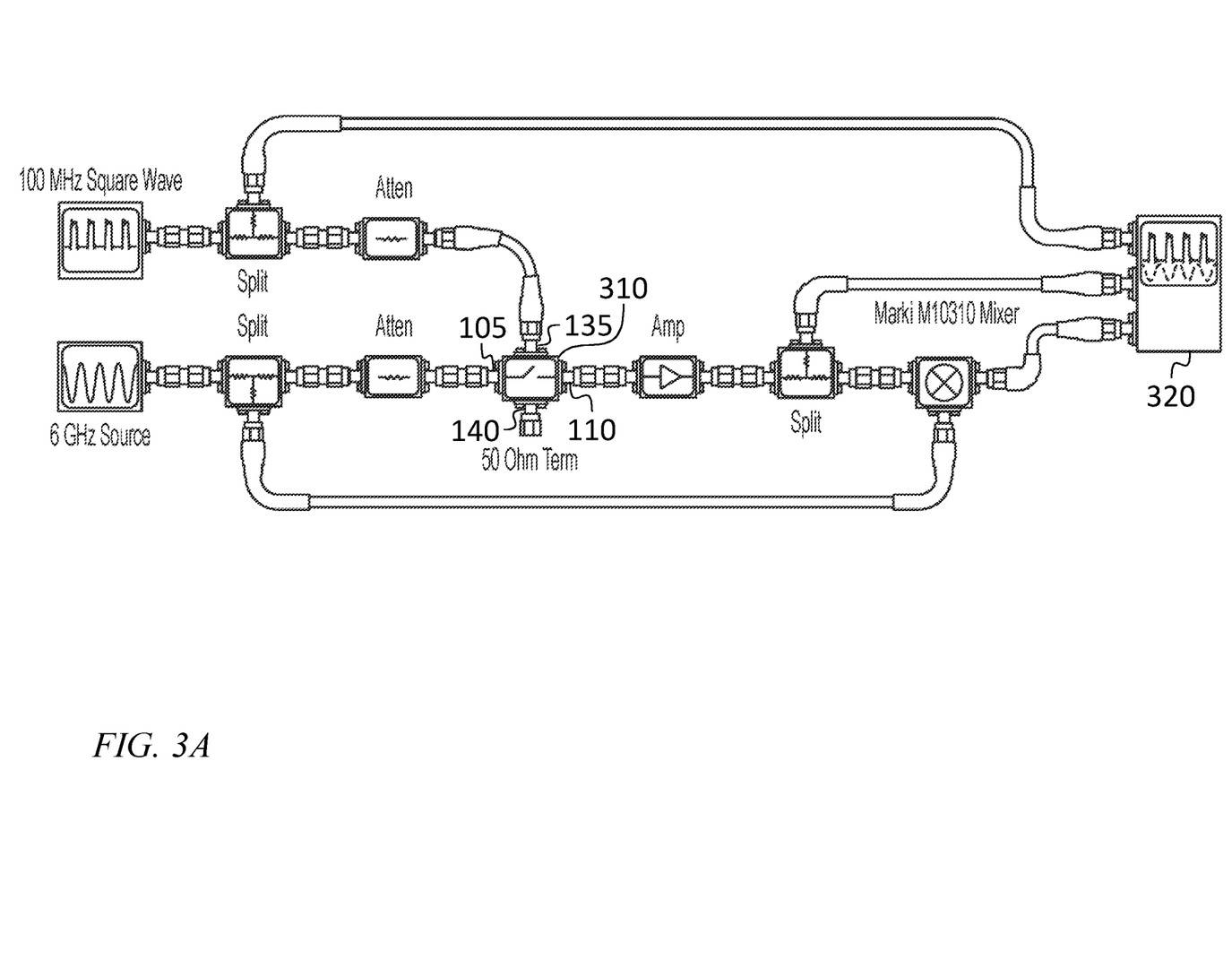
FIG. 3A is a drawing of a test system with a microwave switch, according to an embodiment of the present invention.

FIG. 3A shows a system used to characterize a microwave switch 310, constructed according to one embodiment, and packaged in an enclosure with four SMA connectors, two for the first signal port 105 and the second signal port 110, and two for the first bias port 130 and the second bias port 145. A 6 GHz source supplies an input signal (through a first splitter and an attenuator) to the first signal port 105 of the microwave switch 310. The signal transmitted, by the microwave switch 310, to the second signal port 110 of the microwave switch 310 is demodulated by a mixer, using, at the local oscillator (LO) input of the mixer, the signal split off by the first splitter. This arrangement may produce, at the intermediate frequency (IF) port of the mixer, a DC level proportional to the amplitude of the signal transmitted, by the microwave switch 310, to the second signal port 110 of the microwave switch 310 in the first state. The signal at the output of the mixer is fed to an oscilloscope 320.

A signal source configured to produce a 50 MHz square wave is connected to the first bias port 130, and the second bias port 145 is terminated with a (DC-coupled, 50 ohm) termination to provide a path to ground for the bias current. The 50 MHz square wave signal is also fed to the oscilloscope 320 and used as a trigger. The rise time (i.e., the time the microwave switch takes to transition from the second (off) state to the first (on) state) and the fall time (i.e., the time the microwave switch takes to transition from the first (on) state to the second (off) state) may then be measured with the oscilloscope 320 as the delay between (i) the falling transition of the bias current and the rising transition in the amplitude of the signal transmitted by the microwave switch and (ii) the rising transition of the bias current and the falling transition in the amplitude of the signal transmitted by the microwave switch, respectively. The unmixed output of the switch may also be fed into the oscilloscope 320 as shown, to characterize the transient signal generated by the switching event.

Figure 3B:
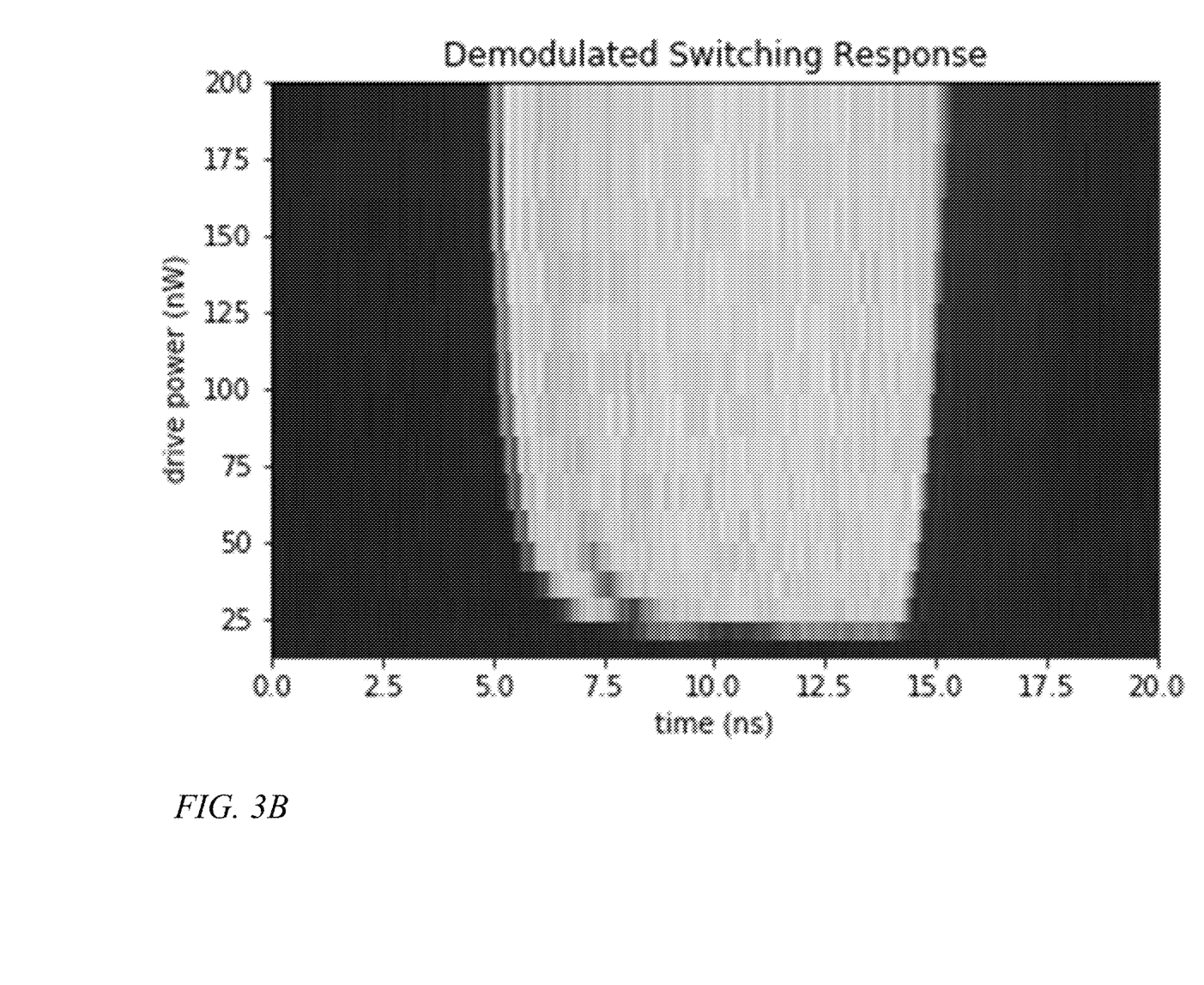
FIG. 3B is a graphical representation of transmitted amplitude of a microwave switch, according to an embodiment of the present invention.
Figure 3C:
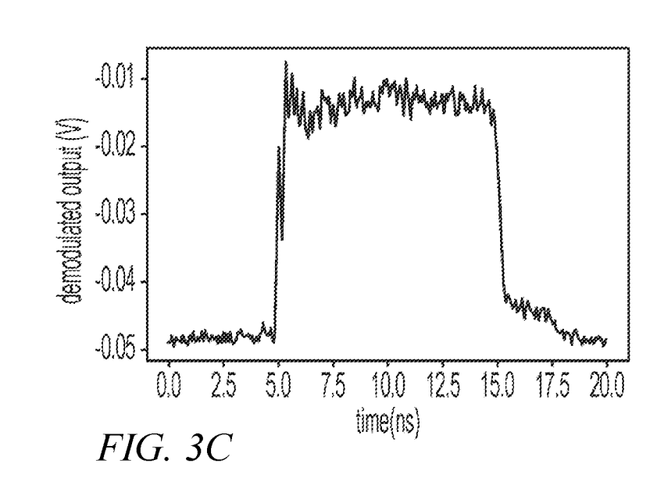
FIG. 3C is a graph of transmitted amplitude, as a function of time, of a microwave switch, according to an embodiment of the present invention.
Figure 3D:
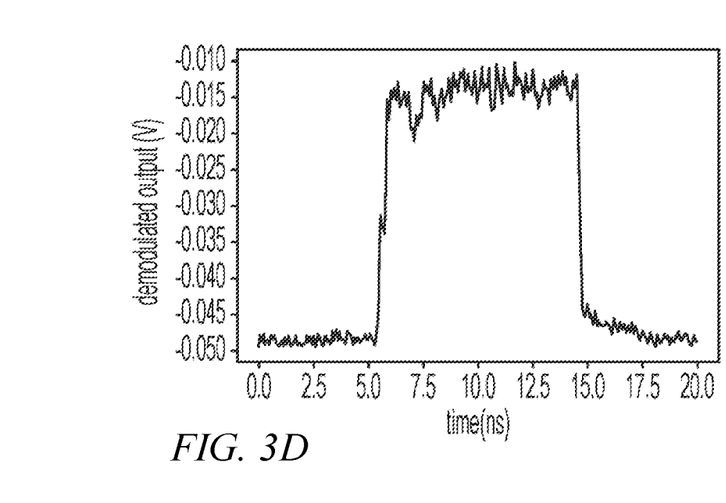
FIG. 3D is a graph of transmitted amplitude, as a function of time, of a microwave switch, according to an embodiment of the present invention.
Figure 3E:
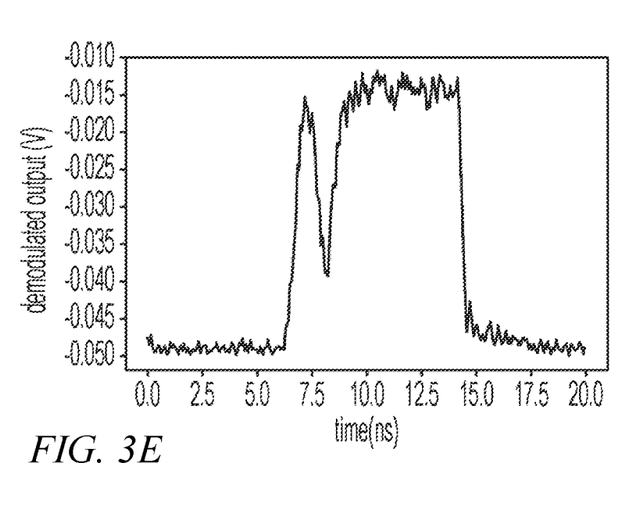
FIG. 3E is a graph of transmitted amplitude, as a function of time, of a microwave switch, according to an embodiment of the present invention.
Figure 3F:
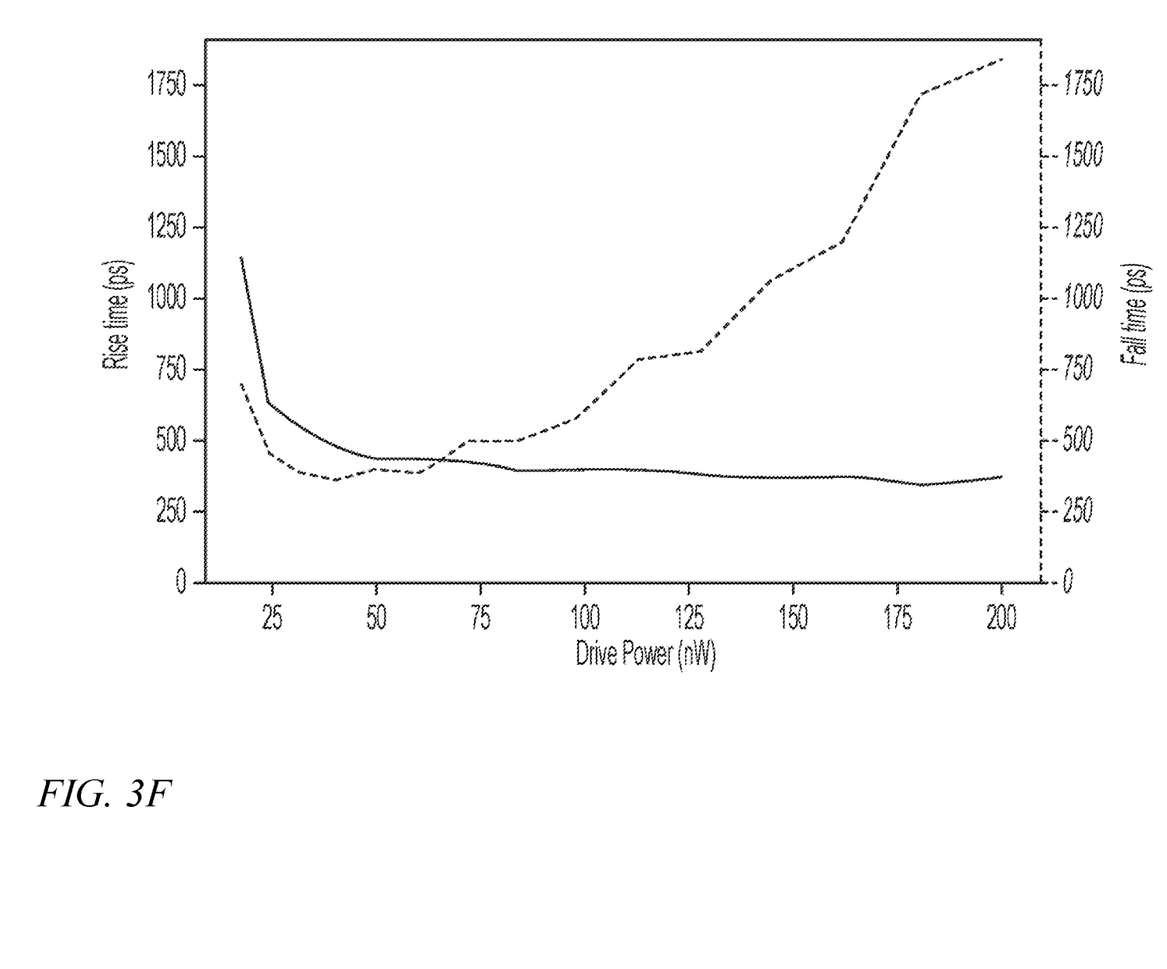
FIG. 3F is a graph of rise time and fall time, of a microwave switch, as a function of bias drive power, according to an embodiment of the present invention.

FIG. 3B shows the results of such measurements. Each row of the image of FIG. 3B corresponds to a different bias power (or "drive power") supplied to the first bias port 130. The brightness of the image of FIG. 3B is proportional, at each point, to the amplitude of the signal transmitted by the microwave switch. It may be seen that at low bias current (e.g. at 25 nW of bias drive power, which heats the narrowed portion 120 more slowly), the microwave switch takes significantly longer (about 2 ns longer) to switch on, than at a higher bias current. Conversely, at high bias current (e.g., at 200 nW), the microwave takes significantly longer (about 500 ps longer) to switch off (having been heated to a higher temperature), than at a lower bias current. FIGS. 3C-3E are oscilloscope traces showing transmitted power as a function of time for bias drive powers of 200 nW, 100 nW, and 25 nW, respectively. FIG. 3F is a graph showing the rise time and the fall time of the microwave switch as a function of bias drive power. The variation in fall time shown in FIG. 3F is large due to the tail visible in FIG. 3C generated at high drive powers. This may be due to heating of the surrounding environment of the wire at high drive power. For FIG. 3F, the rise and fall times are defined as the time required for a pulse to rise (fall) from 10 to 90 (90 to 10)% of the max height. These may not be readily perceptible in FIG. 3B since they are much shorter than the pulse duration.

Figure 4A:
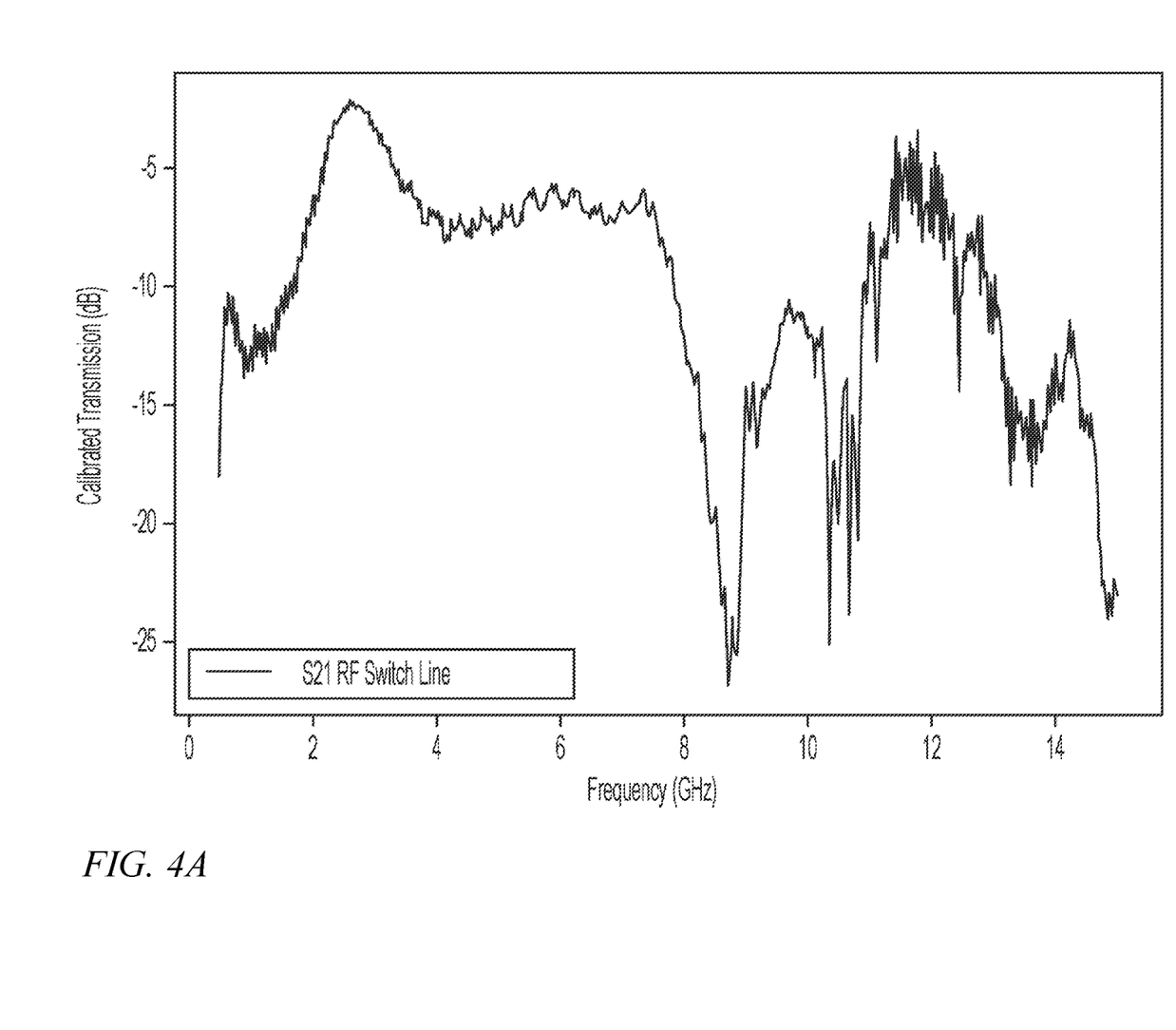
FIG. 4A is a graph of S21 of a microwave switch, according to an embodiment of the present invention.
Figure 4B:
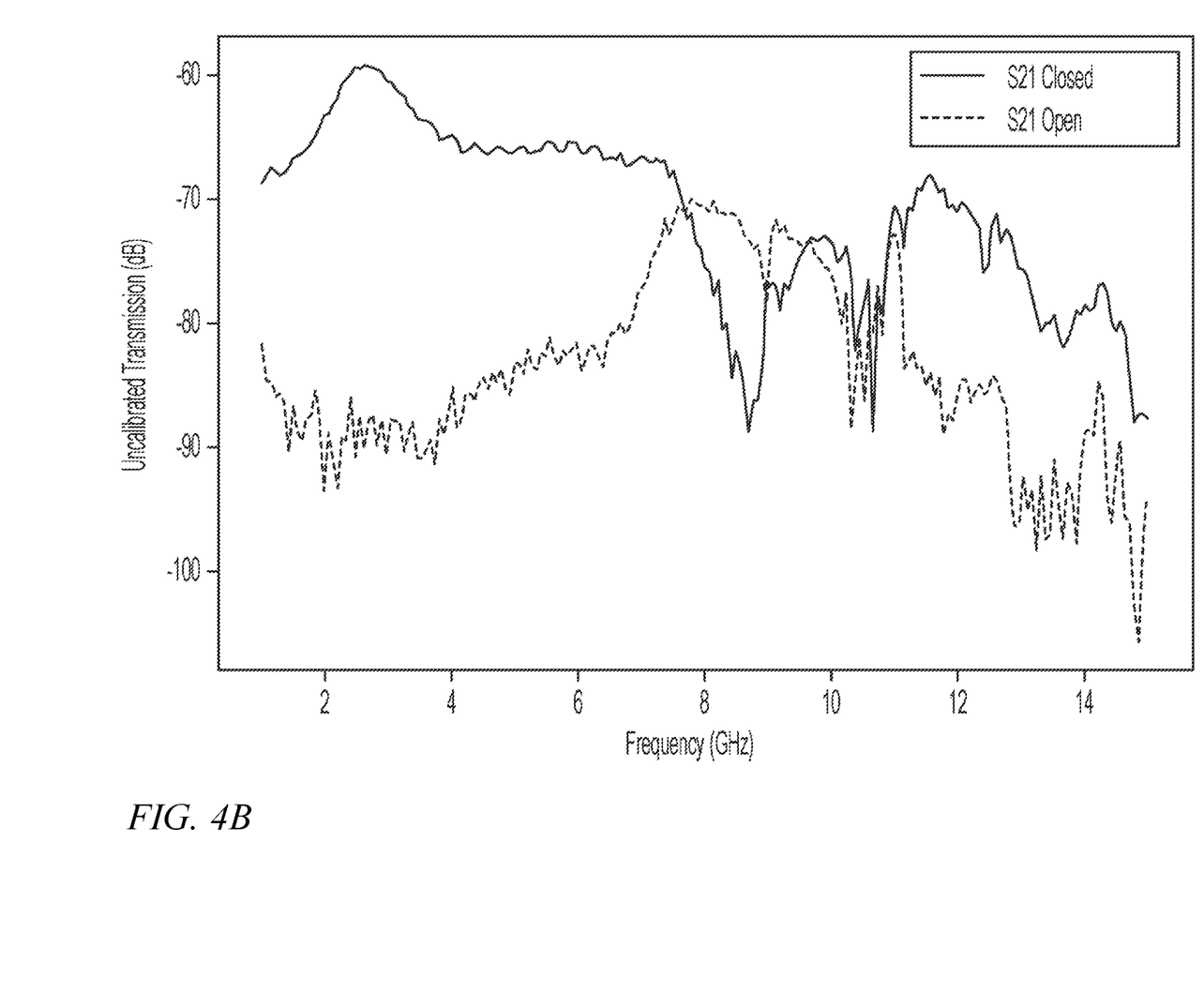
FIG. 4B is a graph of uncalibrated S21 of a microwave switch in an on state and in an off state, according to an embodiment of the present invention.

FIG. 4A is a graph of the magnitude of S21 for the microwave switch in the first state (the on state) as a function of frequency. It may be seen that in the on state, the insertion loss is about 7 dB over the range of frequencies from 3 GHz to 7 GHz, with ripple, over that frequency range, of about +/− 2 dB. FIG. 4B is an uncalibrated graph of the magnitude of S21 (i.e., it is a graph of the magnitude of S21 times a frequency-dependent constant) as a function of frequency, for both the on state (the first state, identified as "Closed" in the legend) and the off state (the second state, identified as "Open" in the legend). It may be seen that the insertion loss increases, when the microwave switch transitions from the first state to the second state, by at least 20 dB over the range of frequencies from 2 GHz to 4 GHz, and by at least 12 dB over the range of frequencies from 1.5 GHz to 6 GHz.

Although the use of niobium nitride as a superconducting material is disclosed for some embodiments, the invention is not limited to this material, and other superconducting materials, such as mercury, lead, other alloys (such as niobium-titanium, and germanium-niobium), ceramics (such as YBCO and magnesium diboride), superconducting pnictides (e.g., fluorine-doped LaOFeAs), or organic superconductors (fullerenes and carbon nanotubes) may be employed instead of niobium nitride.

As used herein, a "superconducting material" is a material that, under suitable conditions (e.g., sufficiently low temperature and current density), is superconducting (i.e., conducts electrical current without a potential gradient), regardless of whether those conditions exist. As such, in the terminology used herein, a material in the normal state may nonetheless be referred to as a "superconducting material", if, under suitable conditions, it would become superconducting. As used herein, the term "major component" refers to a component that is present in a composition, polymer, or product in an amount greater, by weight, than an amount of any other single component in the composition or product. The term "primary component" refers to a component that makes up at least 50% by weight or more of the composition, polymer, or product. As used herein, any structure or layer that is described as being "made of" or "composed of" a substance should be understood (i) in some embodiments, to contain that substance as the primary component and (ii) in some embodiments, to contain that substance as the major component. As used herein, "a portion of" something means all, or less than all, of the thing. As such, for example "a portion of a graphene sheet" means all or less than all of the graphene sheet.

Although limited embodiments of a superconducting microwave switch have been specifically described and illustrated herein, many modifications and variations will be apparent to those skilled in the art. Accordingly, it is to be understood that a superconducting microwave switch employed according to principles of this invention may be embodied other than as specifically described herein. The invention is also defined in the following claims, and equivalents thereof.

What is claimed is:

1. A microwave switch, comprising:
a substrate;
a signal conductor;
a first ground conductor, on a first side of the signal conductor; and
a second ground conductor, on a second side of the signal conductor,
the signal conductor, the first ground conductor, and the second ground conductor being planar conductors on a planar top surface of the substrate,
the signal conductor having:
a first portion composed of a superconducting material, and
a second portion having a reduced cross section,
wherein:
the microwave switch is configured to operate in:
a first state, in which the first portion is in a superconducting state, and
a second state, in which the first portion is in a normal state; and
in the second state, a resistance of the first portion is at least five times a characteristic impedance of the signal conductor, the first ground conductor, and the second ground conductor at a first location, the first location not being in the second portion.

2. The microwave switch of claim 1, wherein the second portion is a portion of the first portion.

3. The microwave switch of claim 1, wherein a length of the second portion is between 100 nm and 200 nm.

4. The microwave switch of claim 1, wherein a width of the second portion is less than 120 nm.

5. The microwave switch of claim 4, wherein the characteristic impedance is greater than 25 ohms and less than 100 ohms.

6. The microwave switch of claim 5, wherein the characteristic impedance is about 50 ohms.

7. The microwave switch of claim 6, wherein the resistance of the first portion in the second state is at least 300 ohms.

8. The microwave switch of claim 4, wherein the microwave switch has a first signal port at one end of the signal conductor and a second signal port at a second end of the signal conductor, wherein:
an insertion loss from the first signal port to the second signal port, in the second state, is greater, over a range of frequencies spanning 1 GHz, by at least 10 dB, than the insertion loss in the first state.

9. A microwave switch, comprising:
a substrate;
a signal conductor;
a first ground conductor, on a first side of the signal conductor; and
a second ground conductor, on a second side of the signal conductor,
the signal conductor, the first ground conductor, and the second ground conductor being planar conductors on a planar top surface of the substrate;
the signal conductor having:
a first portion composed of a superconducting material, and
a second portion having a reduced cross section;
wherein the microwave switch is configured to operate in:
a first state, in which the first portion is in a superconducting state, and
a second state, in which the first portion is in a normal state;
the microwave switch further comprising a first bias port and a second bias port, a current path from the first bias port and the second bias port extending through the second portion;
wherein the microwave switch is configured to operate, in steady state, in:

the second state, when a current flowing between the first bias port and the second bias port exceeds a threshold current, and the first state, otherwise.

10. The microwave switch of claim 9, wherein the threshold current is less than 20 microamperes.

11. The microwave switch of claim 10, wherein, in the second state, the product of the current flowing between the first bias port and the second bias port, and a potential difference between the first bias port and the second bias port is less than 200 nW.

12. The microwave switch of claim 11, wherein, in the second state, the product of the current flowing between the first bias port and the second bias port, and the potential difference between the first bias port and the second bias port is less than 4 nW.

13. The microwave switch of claim 9, wherein the microwave switch is capable of switching from the first state to the second state in less than 1 ns.

14. The microwave switch of claim 9, wherein the microwave switch is capable of switching from the second state to the first state in less than 1 ns.

* * * * *